(12) United States Patent
Ikeda

(10) Patent No.: US 7,435,649 B2
(45) Date of Patent: Oct. 14, 2008

(54) FLOATING-GATE NON-VOLATILE MEMORY AND METHOD OF FABRICATING THE SAME

(75) Inventor: Yuji Ikeda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 112 days.

(21) Appl. No.: 11/201,333

(22) Filed: Aug. 11, 2005

(65) Prior Publication Data

US 2007/0045705 A1    Mar. 1, 2007

(30) Foreign Application Priority Data

Aug. 11, 2004    (JP)    ............... 2004-234086

(51) Int. Cl.
 *H01L 21/336* (2006.01)
(52) U.S. Cl. .................. 438/262; 257/314; 257/329
(58) Field of Classification Search ......... 257/314–329; 438/262
See application file for complete search history.

(56) References Cited

U.S. PATENT DOCUMENTS

| 4,707,717 | A | * | 11/1987 | Hirabayashi et al. | ........ 257/316 |
| 4,924,437 | A | * | 5/1990 | Paterson et al. | ........ 365/185.14 |
| 5,015,601 | A | * | 5/1991 | Yoshikawa | .................. 438/262 |
| 5,159,431 | A | * | 10/1992 | Yoshikawa | .................. 257/316 |
| 5,394,002 | A | * | 2/1995 | Peterson | .................... 257/321 |
| 5,648,285 | A | * | 7/1997 | Ishige | ......................... 438/257 |
| 6,642,569 | B2 | * | 11/2003 | Mori et al. | .................. 257/314 |
| 7,082,055 | B2 | * | 7/2006 | Ichige et al. | ........... 365/185.17 |
| 7,211,866 | B2 | * | 5/2007 | Yuan et al. | .................... 257/350 |
| 2006/0051977 | A1 | * | 3/2006 | Adachi et al. | ............... 438/778 |
| 2006/0172482 | A1 | * | 8/2006 | Komori et al. | .............. 438/211 |

FOREIGN PATENT DOCUMENTS

| JP | 11-031800 | 2/1999 |
| JP | 11-145428 | 5/1999 |

* cited by examiner

*Primary Examiner*—Matthew S. Smith
*Assistant Examiner*—Ankush K. Singal
(74) *Attorney, Agent, or Firm*—Young & Thompson

(57) ABSTRACT

A floating gate non-volatile memory is composed of a semiconductor substrate within which active regions and isolation dielectrics are alternately arranged in a first direction; a word line extending in the first direction to intersect with the active regions and the isolation dielectrics; a plurality of floating gates disposed between the respective active regions and the word lines; and a plurality of contacts connected with diffusion layers formed within the active regions, respectively, the plurality of contacts being arranged in the first direction. The plurality of contacts include drain contacts and a source contact, and the diffusion layers includes drain diffusion layers connected with the drain contacts and a source diffusion layer connected with the source contact. The semiconductor substrate incorporates a conductive source region extending in the first direction, and an embedded diffusion layer. The source region is positioned opposing the plurality of contacts across the word line.

10 Claims, 15 Drawing Sheets

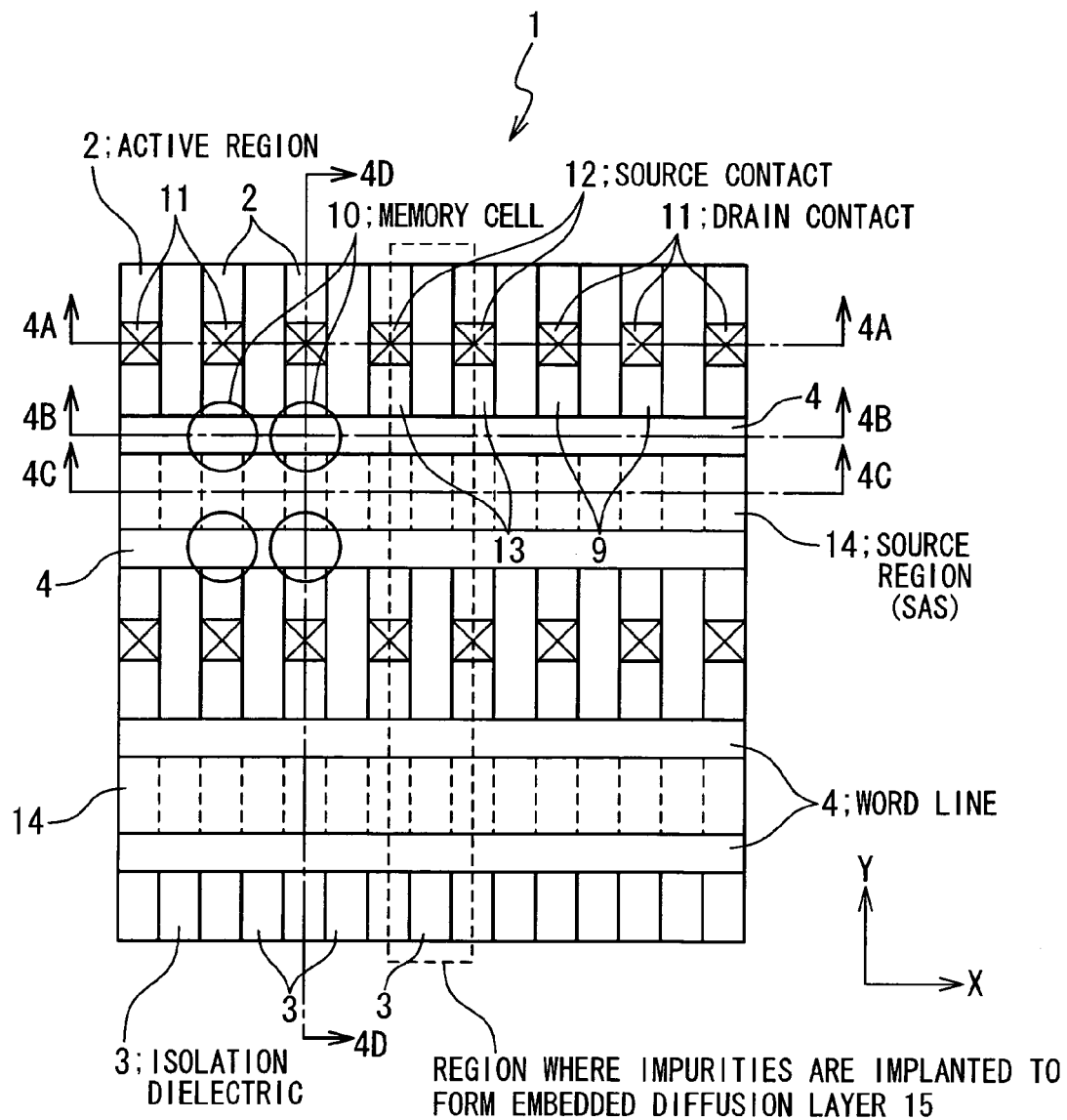

4C-4C 4D-4D

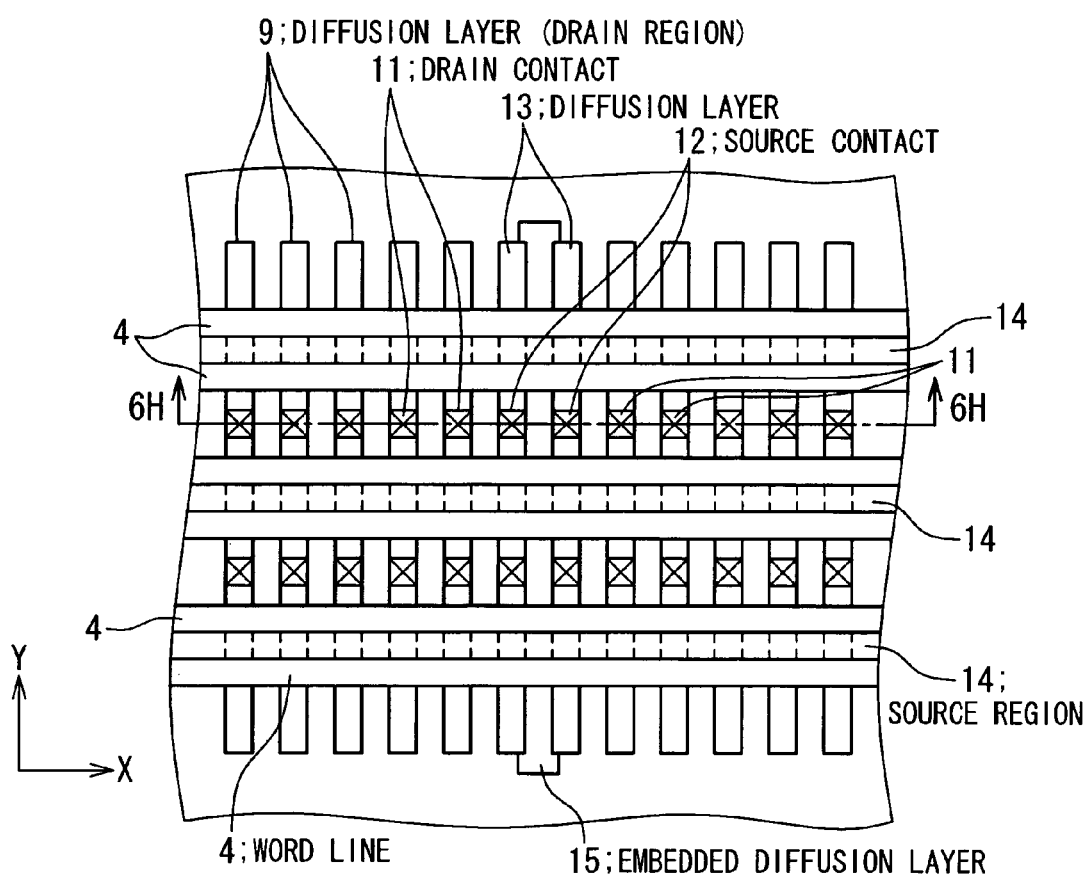

FLOATING-GATE NON-VOLATILE MEMORY AND METHOD OF FABRICATING THE SAME

BACKGROUND OF THE INVENTION

1. Field of the Invention

The present invention relates to floating-gate non-volatile memories, such as flash memories, and method of fabricating the same.

2. Description of the Related Art

As is known in the art, the NOR cell architecture is commonly used within floating-gate non-volatile memories. FIG. 1 illustrates a typical structure of an NOR flash memory, which is disclosed in Japanese Laid-Open Patent Applications No. H11-31800 and H11-145428. In this NOR flash memory, active regions 101 and isolation dielectrics 102 are alternately arranged in a memory array. Word lines 103, which function as control gates, are disposed to intersect the active regions 101 and the isolation dielectrics 102. The intersections of the active regions 101 and the word lines 103 are used as flash memory cells 110, with floating gates (not shown) provided therebetween. Drain regions of the flash memory cells 11 are formed within the active regions 101, and drain contacts 104 are connected to the drain regions. Source regions 105 are formed through a self-aligned source (SAS) technique so that the word lines 103 are positioned between the drain contacts 104 and the source regions 105. Source contacts 106 are connected to the source regions 104.

A drawback of the flash memory structure shown in FIG. 1 is irregularity in the in-plane structure near the source contacts 106. In the structure shown in FIG. 1, the respective intervals of the isolation dielectric 102, the floating gates, and the drain contacts 104 are not constant; the intervals of the isolation dielectric 102, the floating gates, and the drain contacts 104 near the source contacts 106 are different from those away from the source contacts 106. Additionally, the structure shown in FIG. 1 requires the word lines 103 to be curved near the source contacts 106 for providing room for the source contacts 106. Such irregularity enhances the proximity effect during the lithography process, and thereby undesirably causes dimension variances of the memory cells. The dimension variances of the memory cells may cause variances in the memory cell characteristics, and undesirably reduce the operation margin.

Japanese Laid-Open Patent Application No. H11-31800 (previously presented) discloses a flash memory structure for reducing the irregularity in the in-plane structure near the source contacts. In this structure, as shown in FIG. 2, active regions 201 and isolation dielectrics 202 are alternately arranged at constant intervals. Word lines 203, which functions as control gates, are disposed to intersect the active regions 201 and the isolation dielectrics 202. It should be noted that the word lines 203 are free from curvature. Drain contacts 204 and source contacts 205 are arranged in a direction parallel to the word lines 203. Source regions 206 are formed through an SAS technique to oppose the arrays of the drain contacts 204 and the source contacts 205 across the word lines 203. Memory cell transistors are disposed at the intersections of the active regions 201 and the word lines 203. Some of the memory cell transistors are used as depletion transistors 211, which is unable to store data, while the remainders of the memory cell transistors are used to actually store data therein. The depletion transistors 211 provide electrical connections between the source contacts 205 and the source regions 206. Such structure avoids the word lines 203 being curved, and thereby effectively improves regularity in the in-plane structure. The aforementioned Patent Application discloses two techniques for providing depletion transistors 211: one is selective implantation of n-type impurities into the channel regions of the relevant memory cell transistors, and the other is excessive erase of the relevant memory cell transistors.

A drawback of the structure shown in FIG. 2 is difficulty in the formation of the depletion transistors 211. The formation of the depletion transistors 211 through impurity implantation requires forming a resist pattern having openings to the channel regions of the depletion transistors 211. This is quite difficult as a matter of fact, because the active regions 201 are usually arranged at intervals of the minimum dimension of the design rule, and this makes it difficult to establish the alignment margin of the resist pattern.

The formation of the depletion transistors 211 through excessive erase, on the other hand, suffers from operation instability of the depletion transistors 211. During read operations and program operations of the memory cells 210, the word lines 203 are supplied with a positive bias, and this causes electron drift currents through the channel regions. The electrons relevant to the drift currents are partially injected into the floating gates (this phenomenon is known as soft write), and this leads to gradual increase in the threshold voltages of the depletion transistors 211. The increase in the threshold voltages eventually results in that the depletion transistors 211 not to work. As thus described, the use of the depletion transistors for avoiding the structure irregularity near the source contacts is not desirable from the easiness of manufacture.

Therefore, there is a need for providing a novel technique for improving regularity in the memory array structure within the floating-gate non-volatile memory.

SUMMARY OF THE INVENTION

In an aspect of the present invention, a floating gate non-volatile memory is composed of a semiconductor substrate within which active regions and isolation dielectrics are alternately arranged in a first direction; a word line extending in the first direction to intersect with the active regions and the isolation dielectrics; a plurality of floating gates disposed between the respective active regions and the word lines; and a plurality of contacts connected with diffusion layers formed within the active regions respectively, the plurality of contacts being arranged in the first direction. The plurality of contacts include drain contacts and a source contact, and the diffusion layers includes drain diffusion layers connected with the drain contacts and a source diffusion layer connected with the source contact. The semiconductor substrate incorporates a conductive source region extending in the first direction, and an embedded diffusion layer. The source region is positioned opposing the plurality of contacts across the word line. The embedded diffusion layer extends from the source region in a second direction perpendicular to the first direction to be connected with the source diffusion layer.

Such arrangement of the floating gate non-volatile memory allows the drain contacts and the source contact to be arranged in a line, and also allows the word line to be free from curvature. This effectively improves regularity in the memory array structure within the floating gate non-volatile memory.

BRIEF DESCRIPTION OF THE DRAWINGS

The above and other advantages and features of the present invention will be more apparent from the following description taken in conjunction with the accompanied drawings, in which:

FIG. 3 is a plan view illustrating an exemplary structure of a floating-gate non-volatile memory in one embodiment of the present invention;

FIGS. 5A to 5F are plan views illustrating an exemplary process of fabricating the floating-gate non-volatile memory in this embodiment.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

FIG. 3 is a plan view illustrating an exemplary structure of a floating-gate non-volatile memory in one embodiment of the present invention. The floating-gate non-volatile memory is provided with a semiconductor substrate 1 within which active regions 2 and isolation dielectrics 3 are alternately arranged. Word lines 4 are disposed to intersect the active regions 2 and the isolation dielectrics 3, extending in an x-axis direction.

Figure 1:
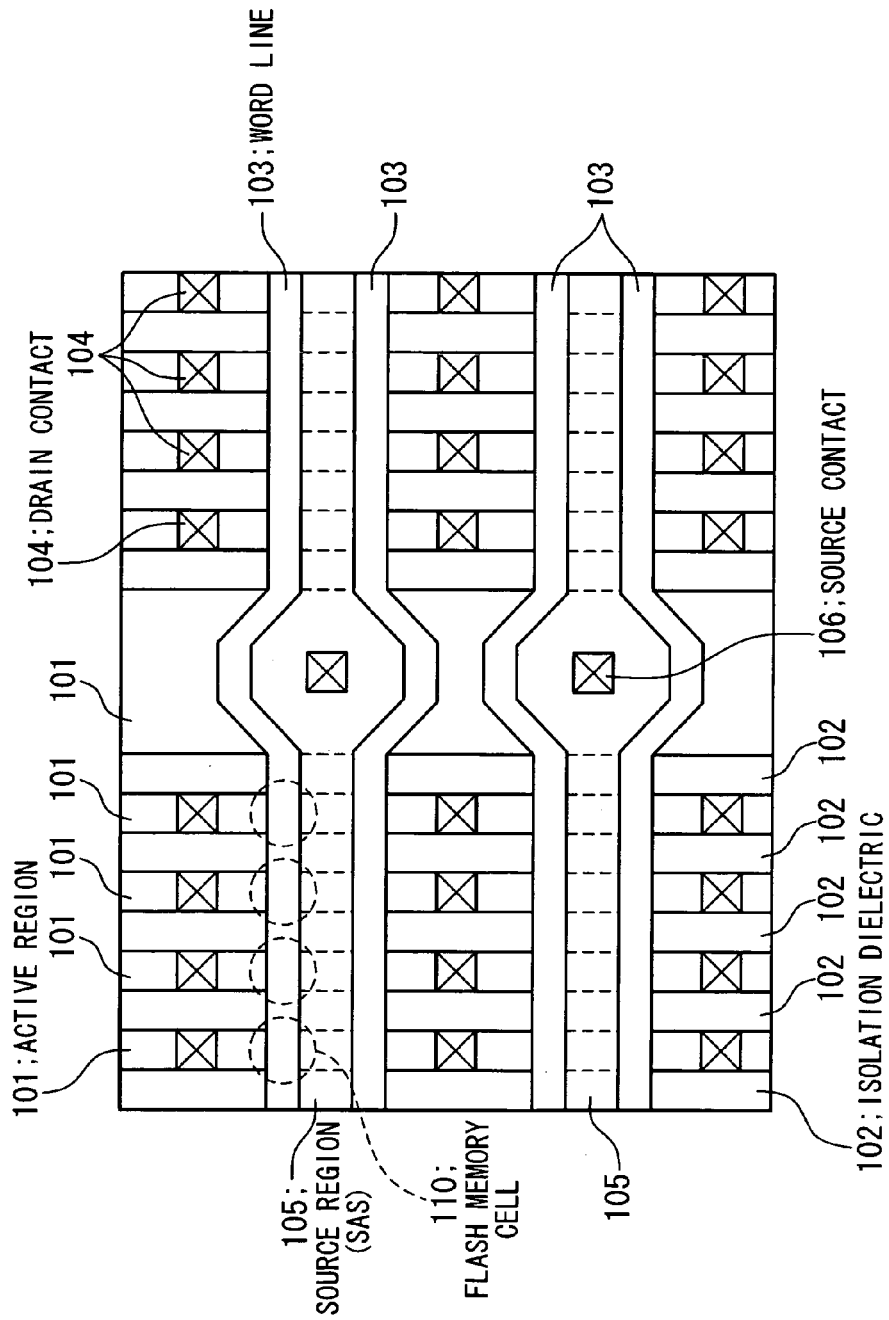
FIG. 1 is a plan view illustrating an exemplary structure of a conventional floating-gate non-volatile memory.
Figure 2:
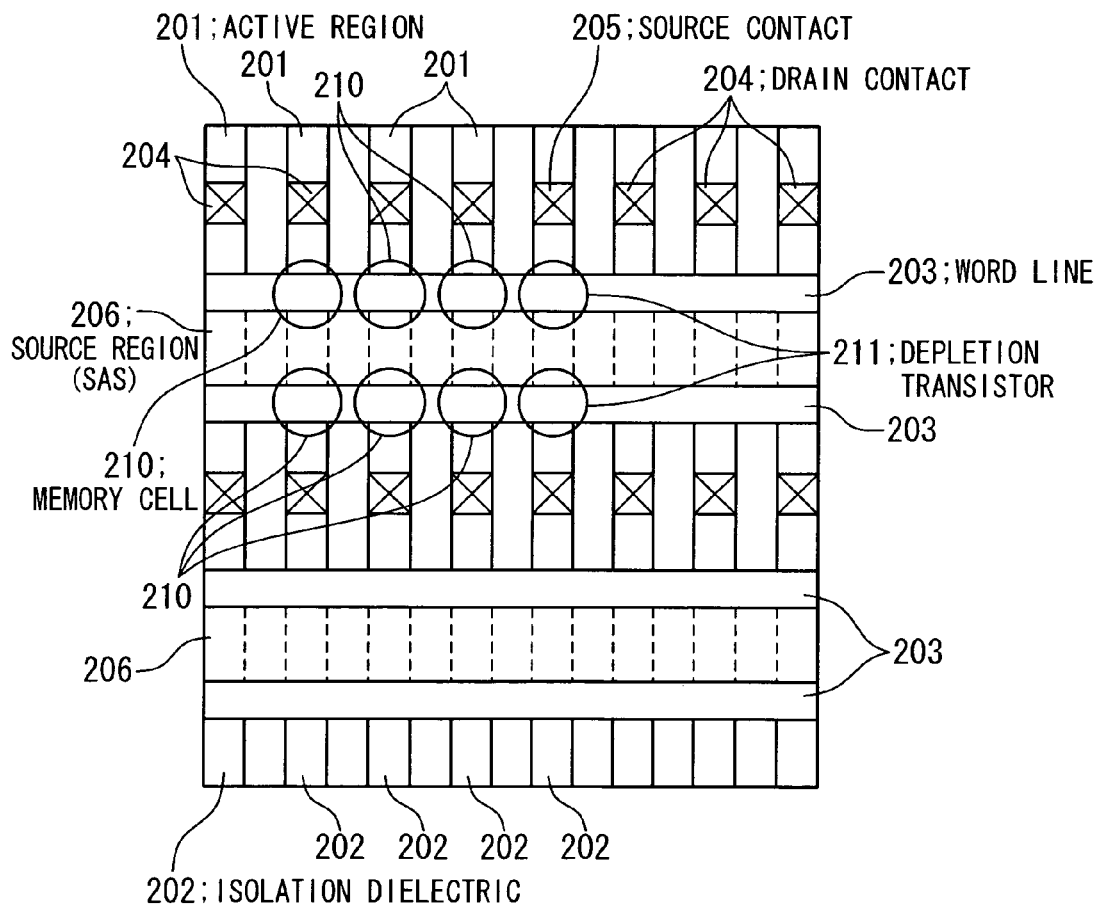
FIG. 2 is a plan view illustrating the structure of another conventional floating-gate non-volatile memory.
Figure 4A:
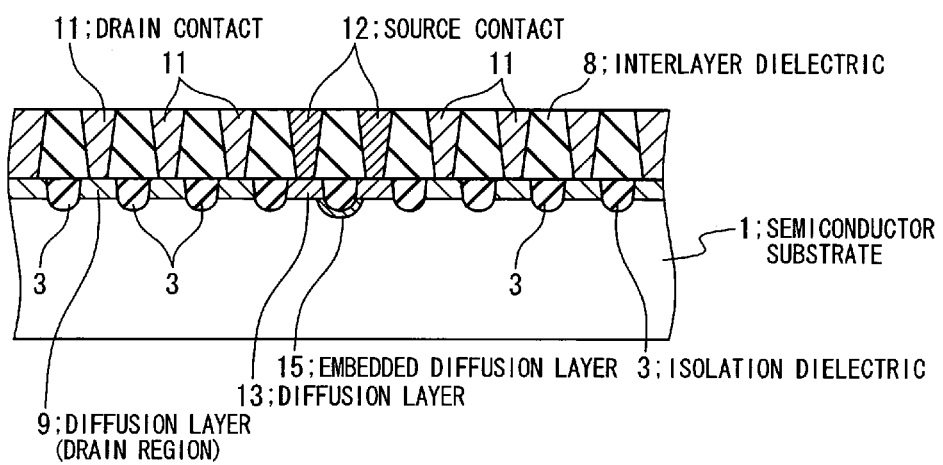
FIGS. 4A to 4D are section views illustrating the structure of a floating-gate non-volatile memory in this embodiment.
Figure 4B:
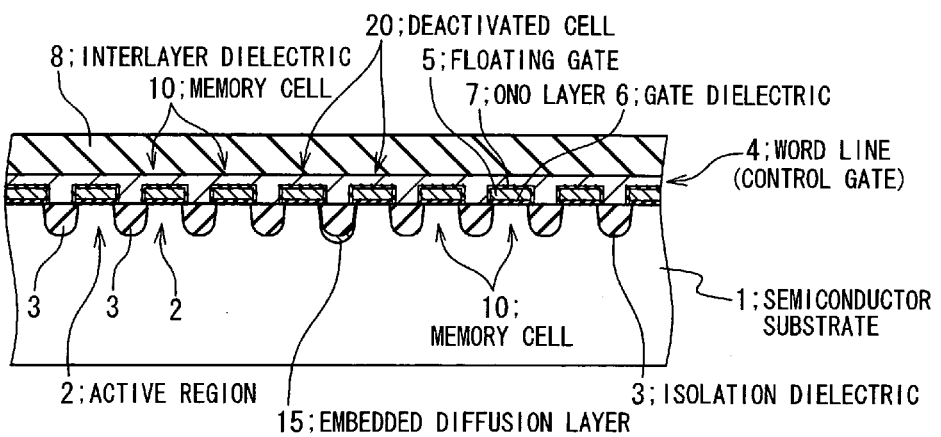

As shown in FIG. 4B, memory cell transistors are formed at the respective intersections of the word lines 4 and the active regions 2. In detail, the memory cell transistors are respectively composed of floating gates 5 disposed between the word lines 4 and the active regions 2. The floating gates 5 are insulated from the active regions 2 by gate dielectrics 6, and also insulated from the word lines 4 by ONO layers 7, where the ONO layers 7 are each composed of a pair of silicon oxide films separated by a silicon nitride film. The word lines 4 function as control gates of the memory cell transistors. The memory cell transistors are covered with an interlayer dielectric 8.

Some of the memory cell transistors are not used for data storage, while the remainders are used to actually store data therein. The memory cell transistors which are not used for data storage are referred to as the deactivated cells 20, hereinafter.

Referring back to FIG. 3, contacts are connected with the respective active regions 2, arranged in the x-axis direction. As shown in FIG. 4A, some of the contacts are used as drain contacts 11 connected with diffusion layers 9, and the remainders are used as source contacts 12 connected with diffusion layers 13. The source contacts 12 consists of adjacent two contacts.

The diffusion layers 9 function as the drains of the memory cell transistors. Therefore, the diffusion layers 9 may be referred to as the drain diffusion layers 9, hereinafter.

Although seeming to structurally function as drains, the diffusion layers 13 are used as conductors providing electrical connections between the source contacts 12 and the source of the memory cell transistors. The drain contacts 11 and the source contacts 12 are disposed to penetrate an interlayer dielectric 8.

Figure 4C:
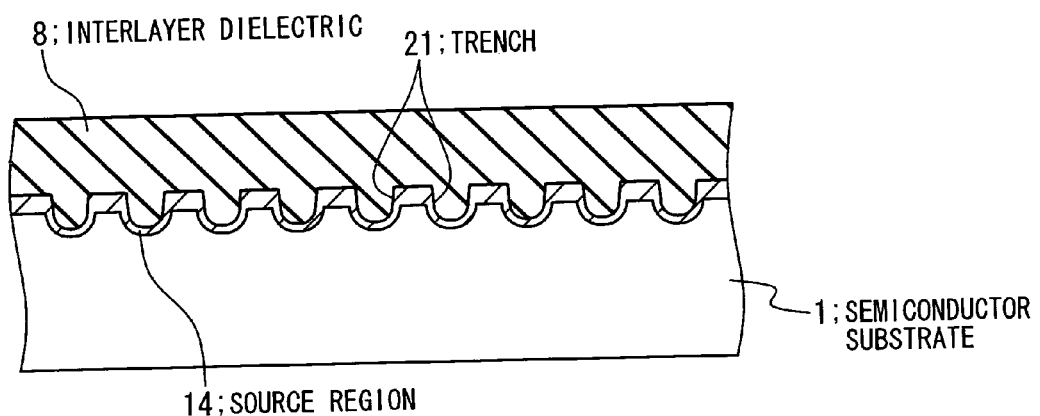
Figure 4D:
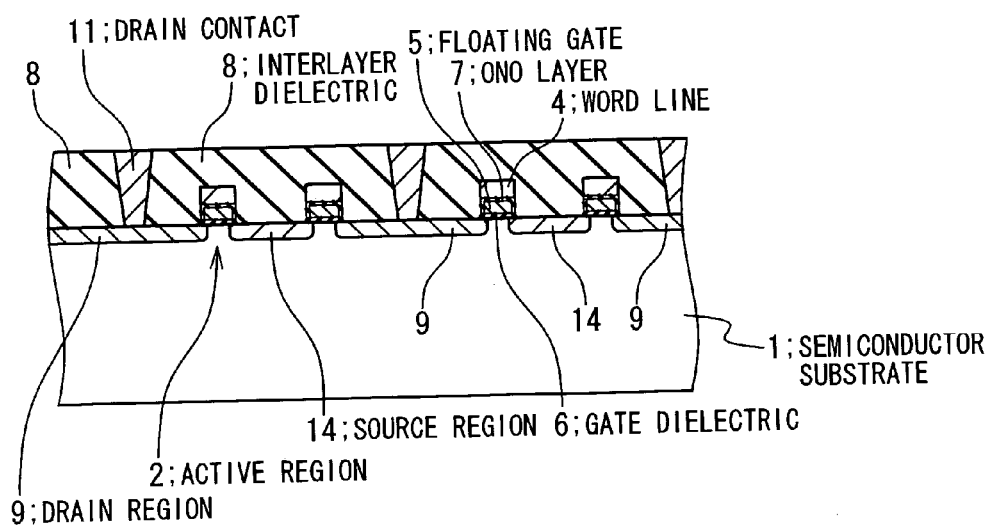

Referring to FIG. 3 again, source regions 14 are disposed to oppose the arrays of the contacts 11 and 12 across the word lines 4. The source regions 14 function as common source of the memory cell transistors. As shown in FIG. 4C, the source regions 14 are formed to extend across the bottom portions of isolation trenches 21, providing electrical connections among the active regions 2. FIG. 4D provides an additional illustration of the structure of the memory cell transistors.

Referring back to FIG. 3, the floating-gate non-volatile memory in this embodiment achieves electrical connections between the source contacts 12 and the source regions 14 using an embedded diffusion layer disposed beneath the isolation dielectric 3 positioned between the adjacent two source contacts 12, the embedded diffusion layer extending from the source regions 14 in a y-direction beneath the relevant isolation dielectric 3. The embedded diffusion layer is denoted by the numeral 15 in FIGS. 4A and 4B. As shown in FIG. 4A, the embedded diffusion layer 15 is connected with the diffusion layers 13 connected with the source contacts 12. Such structure provides an electrical connection of the source regions 14 with the source contacts 12 through the embedded diffusion layer 15 and the diffusion layers 13.

The structure shown in FIG. 3, incorporating the embedded diffusion layer 15 beneath the relevant isolation dielectric 3, eliminates the need for curving the word lines 4, and also allows aligning the drain contacts 11 and the source contacts 12 at constant intervals. Additionally, the structure shown in FIG. 3 does not require providing depletion transistors for providing electrical connections between the source contacts 12 and the source regions 14. The structure thus described effectively improves regularity in the memory array structure with the improved easiness of manufacture.

The structure shown in FIG. 3 additionally has an advantage that the formation of the embedded diffusion layer 15 has a reduced influence on the characteristics of the memory cells 10. Referring to FIG. 4B, the embedded diffusion layer 15 may seem to cause an undesirable influence on the memory cell transistors near the embedded diffusion layer 15. On the contrary, the structure shown in FIG. 3 effectively avoids the influence of the formation of the embedded diffusion layer 15 on the characteristics of the memory cells 10, because the memory cell transistors adjacent to the embedded diffusion layer 15 operate as the deactivated cells 20; the memory cells 10 actually used for data storage are separated away from the embedded diffusion layer 15.

FIGS. 5A to 5F are plan views illustrating an exemplary manufacture process of the floating-gate non-volatile memory shown in FIG. 3, and FIGS. 6A to 6G are section views illustrating the same.

Figure 5A:
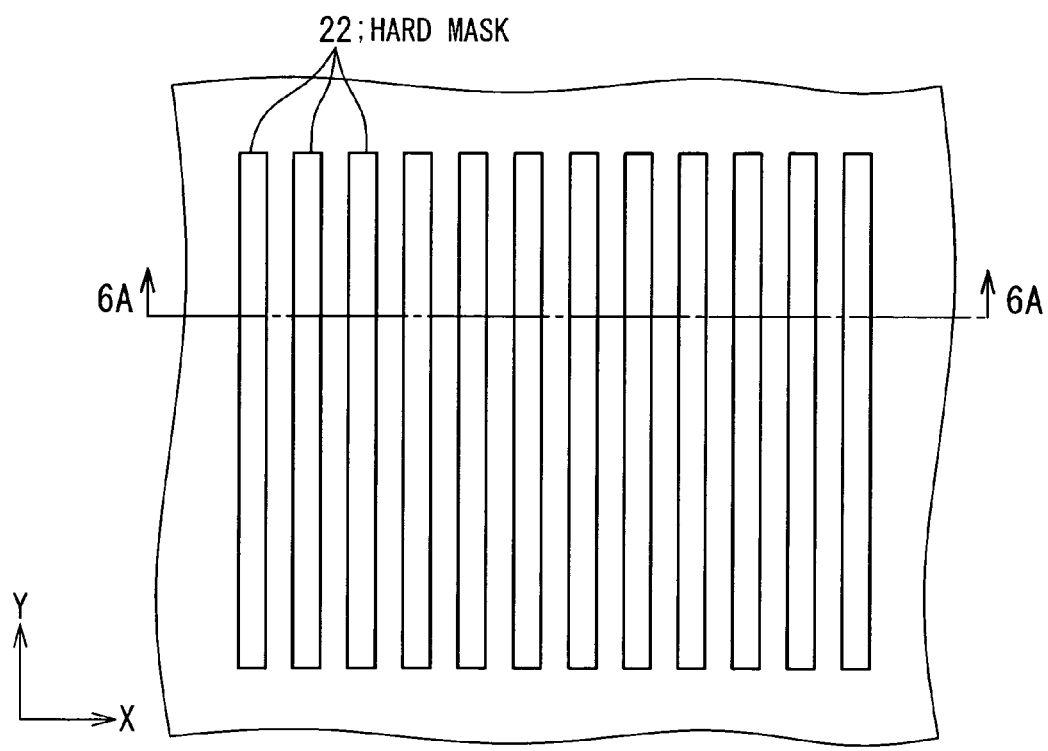
Figure 6A:
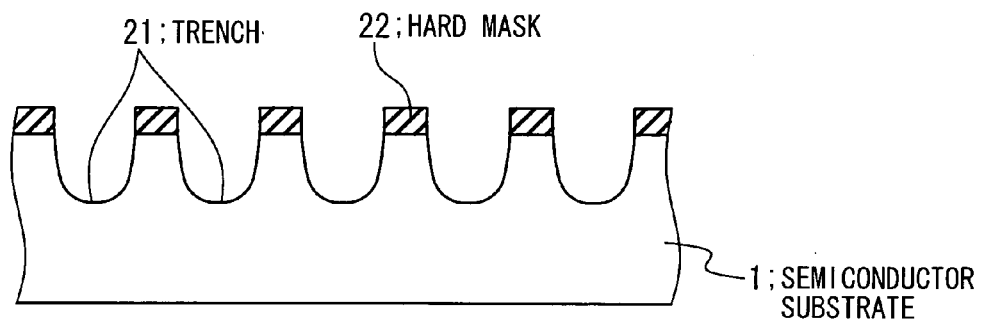
FIGS. 6A to 6H are section views illustrating plan views illustrating the fabricating process of the floating-gate non-volatile memory in this embodiment.

As shown in FIG. 5A, the manufacture process in this embodiment begins with forming a set of hard masks 22 on the semiconductor substrate 1, followed by forming trenches 21 for isolation through etching using the hard masks 22 as shown in FIG. 6A. The trenches 21 are formed to extend in the y-axis direction. The portions of the semiconductor substrate 1 covered with the hard masks 22 are used as the active regions 2, as is understood from the description on the following processes.

Figure 5B:
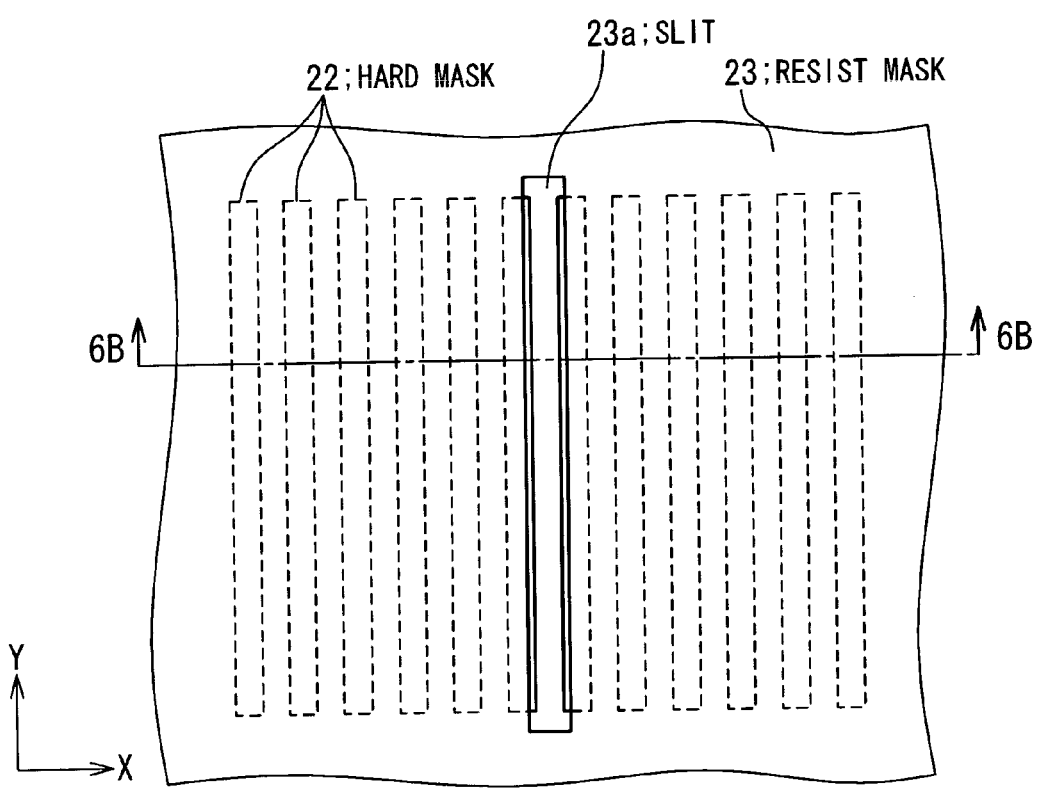

After the formation of the trenches 21, as shown in FIG. 5B, a resist mask 23 is deposited to entirely cover the surface of the semiconductor substrate 1. The resist mask 23 is provided with one slit 23a for several to several tens of the trenches 21. The slit 23a is formed to expose the bottom portion of the trench 21 beneath which the embedded diffusion layer 15 is to be formed.

Figure 6B:
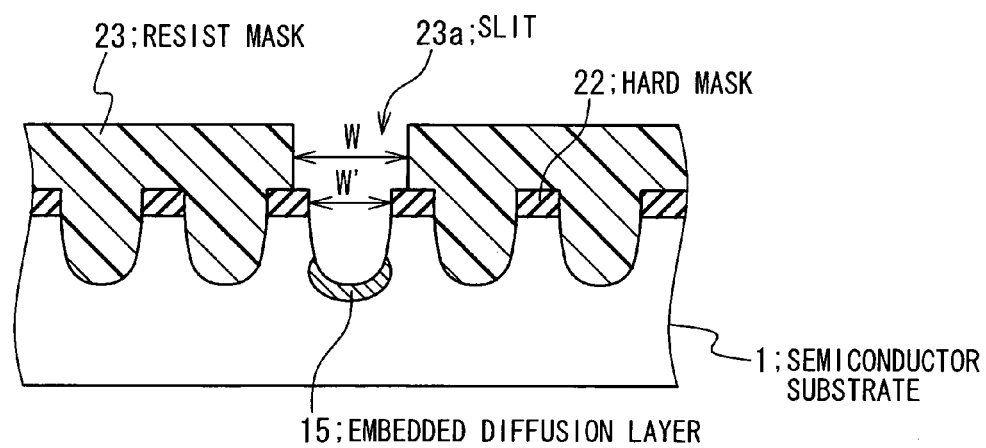

As shown in FIG. 6B, the portion exposed through the slit 23a is then heavily implanted with impurities to form the $N^+$ type embedded diffusion layer 15. It should be noted that the width of the slit 23*a*, denoted by the symbol "W" is allowed to be larger than the intervals of the hard masks 22, denoted by the symbol "W'", because the hard masks 22 remain unremoved to block the impurities during the impurity implantation. This advantageously facilitates the alignment of the slit 23*a*.

After the trenches 21 are then filled with dielectric material to form the isolation dielectrics 3, the hard masks 22 are removed. After the removal of the hard masks 22, the gate dielectrics 6 are then formed on the surface of the semiconductor substrate 1 through thermal oxidation. This is followed by depositing a polysilicon film from which the floating gates 5 are formed. The polysilicon film is etched to form a set of patterns extending in parallel to the trenches 21.

Figure 5C:
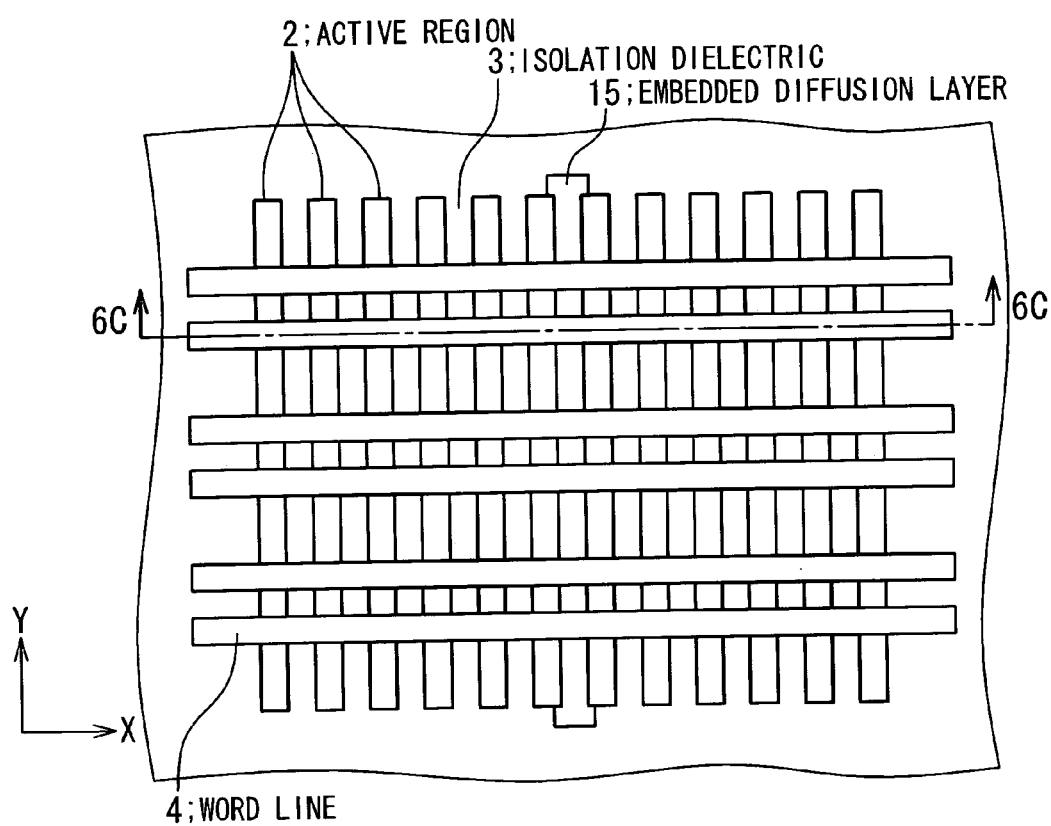
Figure 6C:
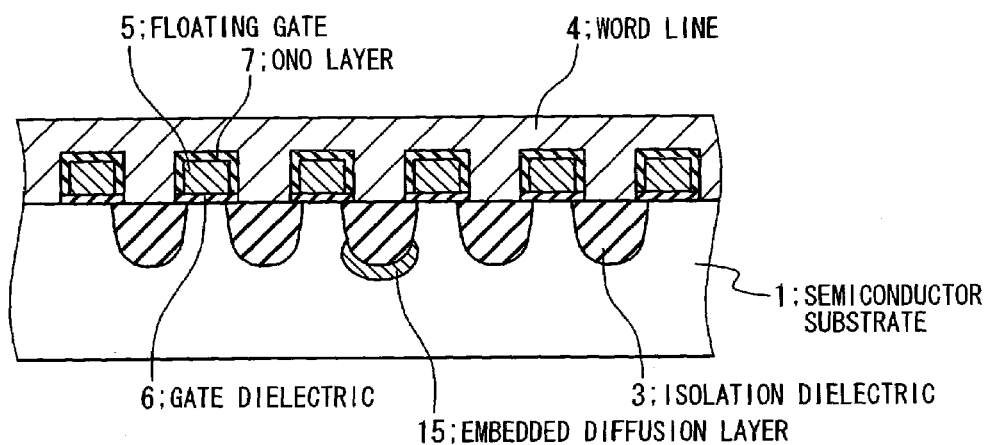

After a film stack including first and second silicon oxide films separated by a silicon nitride film is then formed, the film stack is etched to provide patterns extending in parallel to the x-axis direction. This completes the floating gates 5, the ONO layers 7, and the word lines 4 as shown in FIGS. 5C and 6C. It should be noted that the word lines 4 are used as the control gates of the memory cells 10.

Figure 5D:
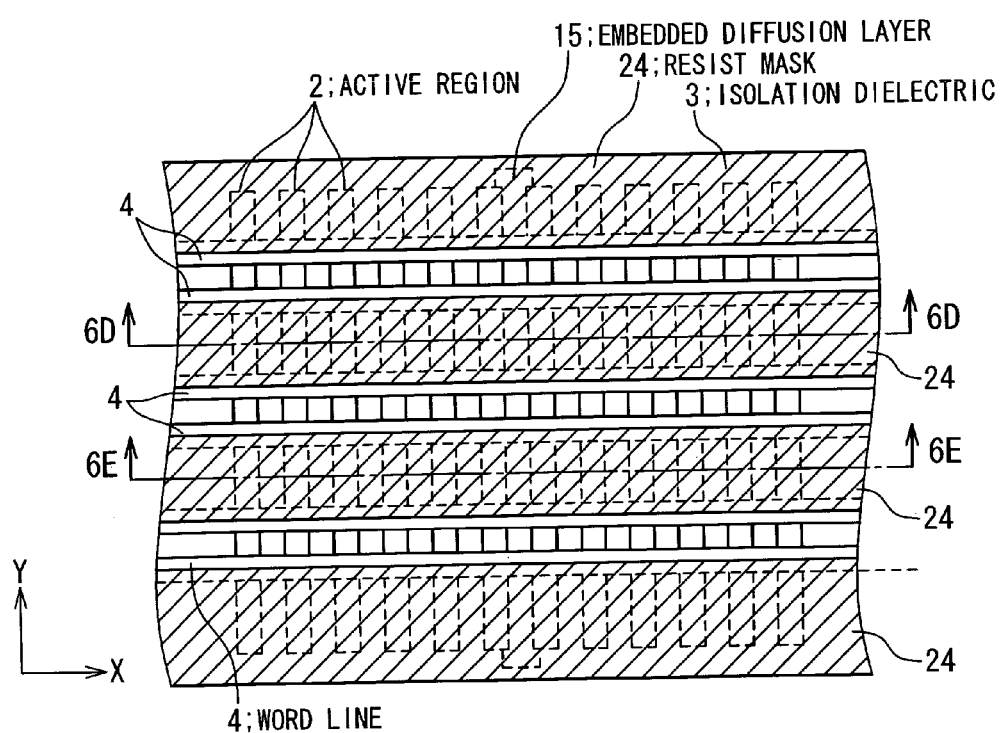
Figure 6D:
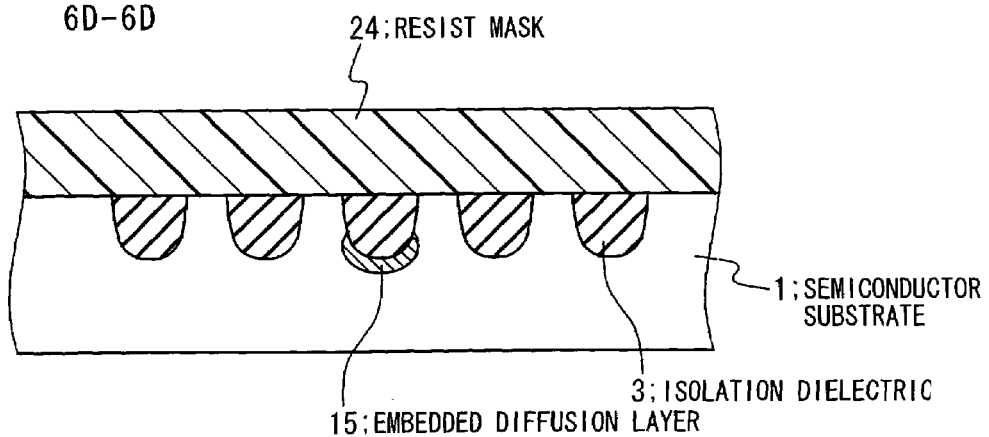
Figure 6E:
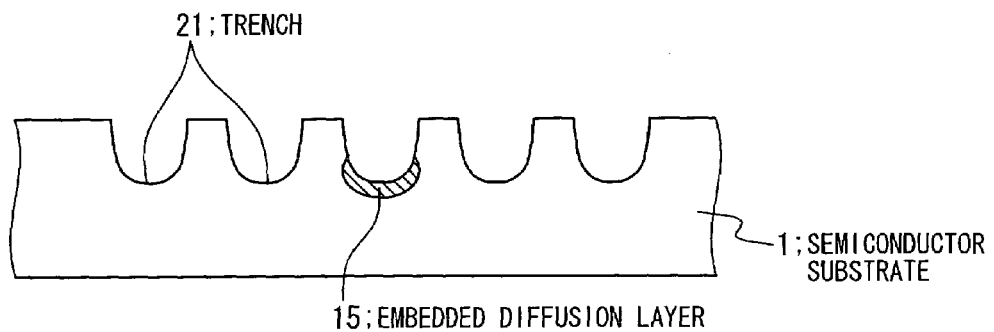

As shown in FIG. 5D, a resist mask 24, used for forming the source regions 14 through an SAS technique, is then formed to cover the semiconductor substrate 1 other than the regions where the source regions 14 are formed. As shown in FIG. 6E, portions of the dielectrics filled in the trenches 21 are then removed using the resist mask 24 to expose the trenches 21 within the regions where the source regions 14 are formed; as shown in FIG. 6D, the remaining portions of the dielectrics in the trenches 21, which are covered with the resist mask 24, remain unremoved.

Figure 5E:
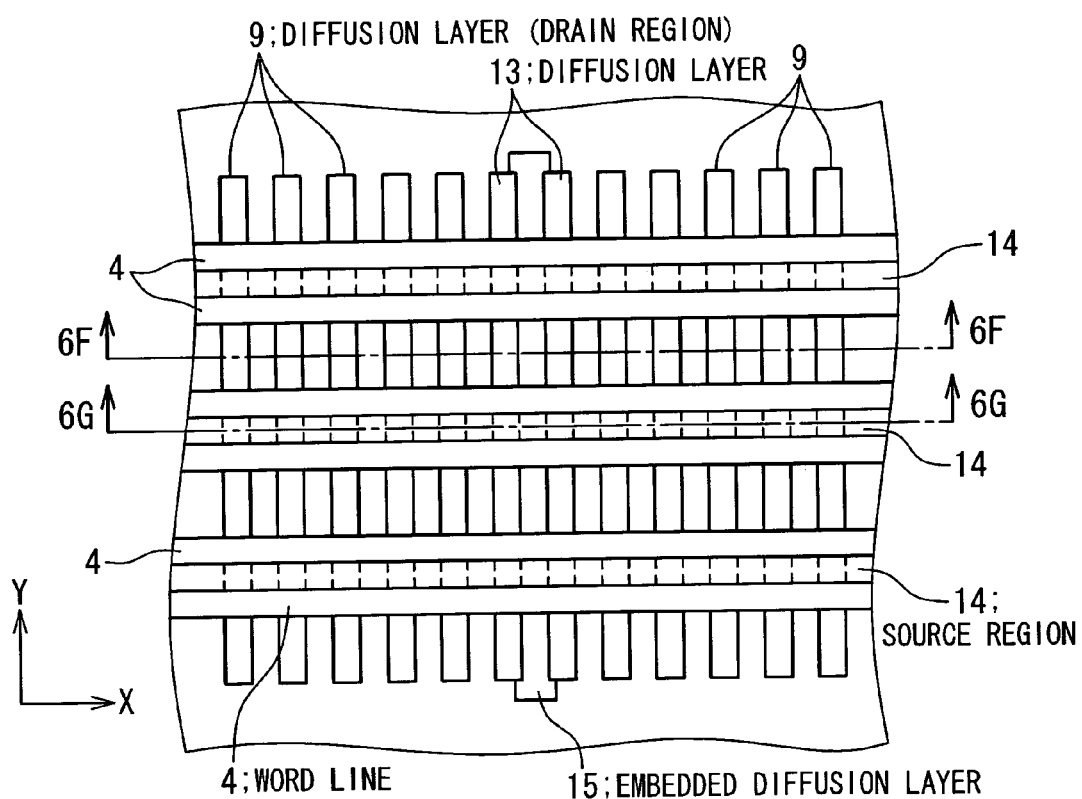
Figure 6F:
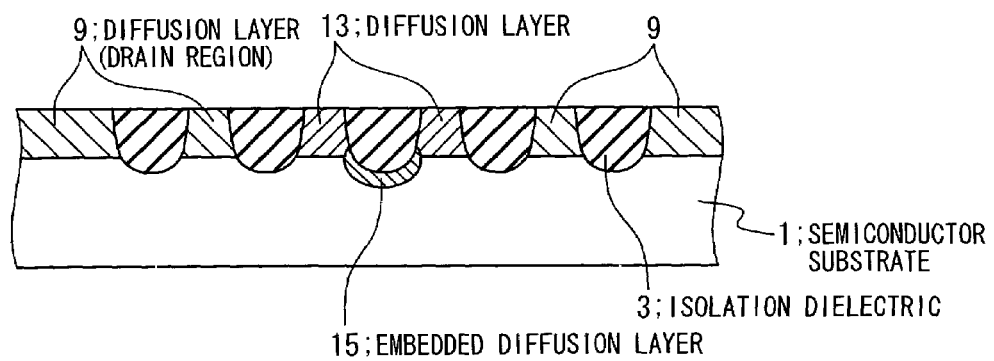
Figure 6G:
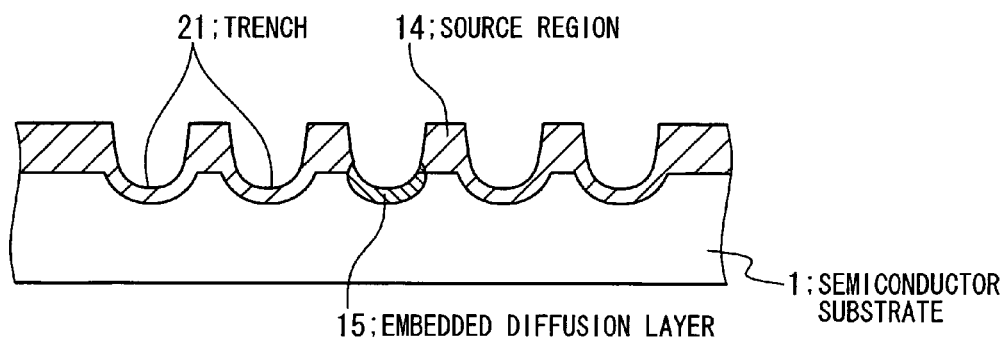

After the resist mask 24 is removed, impurities are then heavily implanted. As shown in FIG. 5E, this completes the (drain) diffusion layers 9, the diffusion layers 13, and the source regions 14. As shown in FIG. 6F, the depth at which the implanted impurities reach is controlled so that the diffusion layers 13 are in contact with the embedded diffusion layer 15. As shown in FIG. 6G, the source regions 14 are formed to intersect with the embedded diffusion layer 15, and the source regions 14 are integrated with the embedded diffusion layer 15 at the intersections.

Figure 6H:
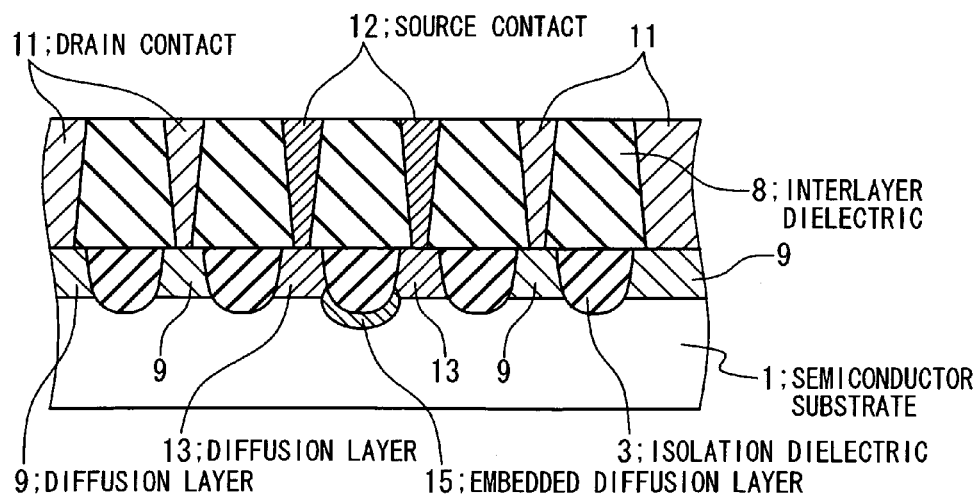

After the semiconductor substrate 1 is covered with the interlayer dielectric 8, as shown in FIG. 5F, the drain contacts 11 and the source contacts 12 are then formed. As shown in FIG. 6H, the drain contacts 11 are formed to reach the drain diffusion layers 9 through the interlayer dielectric 8, and the source contacts 12 are formed to reach the diffusion layers 13. This completes the non-volatile memory structure shown in FIG. 3.

As thus described, the floating-gate non-volatile memory in this embodiment is designed to incorporate the embedded diffusion layer 15 beneath the associated isolation dielectric 3, and thereby effectively improves the regularity in the memory array structure with the easiness of manufacture.

It is apparent that the present invention is not limited to the above-described embodiments, which may be modified and changed without departing from the scope of the invention.

What is claimed is:

1. A floating gate non-volatile memory comprising:
    a semiconductor substrate within which active regions and isolation dielectrics are alternately arranged in a first direction;
    a word line extending in said first direction to intersect with said active regions and said isolation dielectrics,
    a plurality of floating gates disposed between said respective active regions and said word line; and
    a plurality of contacts connected with diffusion layers formed within said active regions respectively, said plurality of contacts being arranged in said first direction,
    wherein said plurality of contacts include drain contacts and a source contact, and said diffusion layers includes drain diffusion layers connected with said drain contacts and a source diffusion layer connected with said source contact,
    wherein said semiconductor substrate includes:
    a conductive source region extending in said first direction, said source region being positioned opposing said plurality of contacts across said word line; and
    an embedded diffusion layer extending from said source region in a second direction perpendicular to said first direction, connected with said source diffusion layer.

2. The floating-gate nonvolatile memory according to claim 1, wherein said embedded diffusion layer is positioned beneath adjacent one of said isolation dielectrics, said adjacent one being adjacent to said source contact.

3. The floating-gate non-volatile memory according to claim 2, wherein said plurality of contacts further includes another source contact positioned adjacent to said source contact across said adjacent one of said isolation dielectrics.

4. The floating-gate non-volatile memory according to claim 1, wherein said plurality of active regions and said plurality of said isolation dielectrics are alternately arranged at constant intervals.

5. The floating-gate non-volatile memory according to claim 1, wherein said word line is free from curvature near said source contact.

6. A floating-gate non-volatile memory comprising:
    a plurality of first diffusion layers extending in a first direction;
    a plurality of isolation dielectrics adjacent to said first diffusion layers, respectively, extending in said first direction;
    a word line extending in a second direction perpendicular to said first direction;
    a plurality of contacts disposed on said first diffusion layers;
    a second diffusion layer disposed beneath one of said isolation dielectrics, extending in said first direction, thereby a plurality of memory cells are provided with said first diffusion layers, said second diffusion layer, said word line; and
    a common source layer electrically connected to ones of said first diffusion layers through said second diffusion layer, said ones being adjacent to said second diffusion layer,
    wherein the contacts connected to remaining ones of said first diffusion layers are drain contacts.

7. The floating-gate non-volatile memory according to claim 6, wherein said plurality of contacts are arranged in a direction in which said word line extends.

8. The floating-gate non-volatile memory according to claim 6, wherein said first diffusion layers and said contacts are arranged at constant intervals.

9. A method for manufacturing a floating-gate non-volatile memory, said method comprising:
    forming an array of hard masks arranged in a first direction on a semiconductor substrate, said hard masks being used for defining active regions;
    forming a plurality of trenches for isolation extending in a second direction perpendicular to said first direction through etching using said hard masks;
    forming an embedded diffusion layer within a bottom portion of one of said trenches;

filling said plurality of trenches with isolation dielectrics;

forming an array of floating gates over said active regions, arranged in said first direction;

forming a word line positioned over said floating gates so that said word line intersects with said active regions and said isolation dielectrics;

forming diffusion layers and a source region in surface portions of said active regions, said diffusion layers being positioned on one side of said word line, and said source region being positioned on another side of said word line; and forming a plurality of contacts connected to said diffusion layers, respectively, arranged in said first direction;

wherein said plurality of contacts includes drain contacts and a source contact, wherein one of said diffusion layers is connected to said embedded diffusion layer, said one of said diffusion layers also being connected to said source contact; and wherein said source region is connected to said embedded diffusion layer.

10. The method according to claim 9, wherein said forming said embedded diffusion layer includes:

depositing a mask having an opening exposing said one of said trenches; and implanting impurities through said opening to form said embedded diffusion layer, and wherein said a width of said opening in said first direction is larger than intervals of said hard masks.

* * * * *